US012559651B2

(12) United States Patent
Bae et al.

(10) Patent No.: US 12,559,651 B2
(45) Date of Patent: Feb. 24, 2026

(54) BUFFER FILM

(71) Applicant: LG Chem, Ltd., Seoul (KR)

(72) Inventors: Choong Man Bae, Daejeon (KR); Dong Woo Yoo, Daejeon (KR); Cheol Hee Lee, Daejeon (KR); Jin Kyu Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 520 days.

(21) Appl. No.: 18/020,513

(22) PCT Filed: Sep. 2, 2021

(86) PCT No.: PCT/KR2021/011802
§ 371 (c)(1),
(2) Date: Feb. 9, 2023

(87) PCT Pub. No.: WO2022/050697
PCT Pub. Date: Mar. 10, 2022

(65) Prior Publication Data
US 2023/0269962 A1      Aug. 24, 2023

(30) Foreign Application Priority Data

Sep. 2, 2020 (KR) ........................ 10-2020-0111885
Sep. 10, 2020 (KR) ........................ 10-2020-0116206
Oct. 30, 2020 (KR) ........................ 10-2020-0143626

(51) Int. Cl.
*C09J 7/28* (2018.01)
*B32B 5/18* (2006.01)
(Continued)

(52) U.S. Cl.
CPC .................... *C09J 7/28* (2018.01); *B32B 5/18* (2013.01); *H10K 50/00* (2023.02);
(Continued)

(58) Field of Classification Search
None
See application file for complete search history.

(56) References Cited

U.S. PATENT DOCUMENTS

2005/0046345 A1      3/2005  Park
2005/0068738 A1*     3/2005  Kim .................... H01L 23/3733
                                                    257/E23.112
(Continued)

FOREIGN PATENT DOCUMENTS

CN          1592516 A          3/2005
CN          1602151 A          3/2005
(Continued)

OTHER PUBLICATIONS

Inoue—JP 2006-243199 A—PCT D2—MT—reflective sheet—2006 (Year: 2006).*
(Continued)

*Primary Examiner* — John Vincent Lawler
(74) *Attorney, Agent, or Firm* — Lerner David LLP

(57) ABSTRACT

A buffer film and an organic light emitting device (OLED) including the same are disclosed herein. In some embodiments, a buffer film comprises a porous metal sheet having average reflectance of 50% or less for light in a wavelength range of 400 to 800 nm. The buffer film can exhibit heat dissipation properties, electromagnetic wave shielding properties and impact resistance (or impact mitigation properties) required for an OLED. The buffer film is capable of securing the characteristics required for an OLED without price increase, process complexity, and thickness increase of the OLED.

14 Claims, 2 Drawing Sheets

(51) Int. Cl.
| | |
|---|---|
| *H10K 50/00* | (2023.01) |
| *H10K 50/842* | (2023.01) |
| *H10K 50/844* | (2023.01) |
| *H10K 50/87* | (2023.01) |

(52) U.S. Cl.
CPC ....... *H10K 50/8423* (2023.02); *H10K 50/844* (2023.02); *H10K 50/87* (2023.02)

(56) References Cited

U.S. PATENT DOCUMENTS

| | | | |
|---|---|---|---|
| 2005/0214630 A1* | 9/2005 | Yoshida | H01M 8/023 |
| | | | 429/534 |
| 2009/0174987 A1* | 7/2009 | Mizuno | H01G 9/045 |
| | | | 427/79 |
| 2010/0101856 A1 | 4/2010 | Yee et al. | |
| 2012/0132916 A1 | 5/2012 | Jung | |
| 2013/0193415 A1 | 8/2013 | Choi et al. | |
| 2013/0323499 A1 | 12/2013 | Choi et al. | |
| 2014/0077181 A1 | 3/2014 | Kim | |
| 2014/0191212 A1 | 7/2014 | Lienhart | |
| 2014/0353623 A1 | 12/2014 | Yi et al. | |
| 2015/0017549 A1 | 1/2015 | Nishimura et al. | |
| 2017/0040573 A1 | 2/2017 | Bonrad et al. | |
| 2020/0194710 A1* | 6/2020 | Zhao | H10K 50/87 |
| 2020/0197868 A1 | 6/2020 | Tano et al. | |
| 2021/0138768 A1 | 5/2021 | Shin et al. | |
| 2021/0259143 A1 | 8/2021 | Shin et al. | |

FOREIGN PATENT DOCUMENTS

| | | | | | |
|---|---|---|---|---|---|
| JP | 2000-252057 | A | | 9/2000 | |
| JP | 2005-107487 | A | | 4/2005 | |
| JP | 2006243199 | A | * | 9/2006 | .............. G02B 5/08 |
| JP | 2009-164412 | A | | 7/2009 | |
| JP | 2014160663 | A | | 9/2014 | |
| JP | 2020-100741 | A | | 7/2020 | |
| JP | 2020-524749 | A | | 8/2020 | |
| KR | 20050030797 | A | | 3/2005 | |
| KR | 100965251 | B1 | | 6/2010 | |
| KR | 20140037601 | A | | 3/2014 | |
| KR | 20140141330 | A | | 12/2014 | |
| KR | 101910561 | B1 | | 10/2018 | |
| KR | 20200002687 | A | | 1/2020 | |
| WO | 2012172258 | A1 | | 12/2012 | |
| WO | 2013140942 | A1 | | 9/2013 | |
| WO | 2015093149 | A1 | | 6/2015 | |

OTHER PUBLICATIONS

Extended European Search Report for Application No. 21864656.0 dated Jan. 25, 2024. 6 pgs.

Search Report dated Jul. 17, 2025 from the Office Action for Chinese Application No. 202180052166.6 issued Jul. 19, 2025. 2 pgs.

International Search Report for Application No. PCT/KR2021/011802 mailed Dec. 21, 2021, pp. 1-4.

* cited by examiner

| 20 |
|----|
| 10 |
| 30 |

| 20 |
|----|
| 10 |
| 100 |

| 20 |
|----|
| 10 |
| 100 |
| 40 |

BUFFER FILM

CROSS-REFERENCE TO RELATED APPLICATIONS

This application is a national phase entry under 35 U.S.C. § 371 of International Application No. PCT/KR2021/011802, filed on Sep. 2, 2021, which claims priority from Korean Patent Application No. 10-2020-0111885, filed on Sep. 2, 2020, Korean Patent Application No. 10-2020-0116206, filed on Sep. 10, 2020, and Korean Patent Application No. 10-2020-0143626, filed on Oct. 30, 2020, the disclosures of which are incorporated by reference herein.

TECHNICAL FIELD

The present disclosure relates to a buffer film and a use thereof.

BACKGROUND ART

Since organic light emitting devices can emit light by themselves, they are advantageous in implementing thin devices compared to other devices such as LCDs (liquid crystal devices), and are also in configuring flexible devices such as foldable or rollable devices.

However, the organic light emitting device is vulnerable to external impacts such as drop impacts, and as the frequency of applying the organic light emitting device to mobile devices increases, the problem due to the external impact becomes bigger and bigger.

As a device equipped with an organic light emitting device is configured to be thinner, the problem of electromagnetic waves and heat generated from the organic light emitting device or an electronic element connected thereto, and the like also increases.

The organic light emitting device may comprise a substrate on which an organic light emitting layer is formed, and usually comprise a driving circuit part for driving the organic light emitting layer and an electronic element for transmitting a signal to the driving circuit part. When an electronic element is present, the electronic element may be located on the back side of the substrate. As illustratively shown in FIG. 1, in the case of the foregoing, the organic light emitting device may have a structure in which the organic light emitting layer (20) is present on the first surface around the substrate (10) and the electronic element (30) is present on the second surface.

In such a structure, a problem may occur while heat generated in the organic light emitting layer or driving circuit is transferred to the electronic element or, conversely, heat generated in the electronic element or a battery is transferred to the organic light emitting layer or the driving circuit. Therefore, it is necessary to efficiently process the heat generated as above.

In addition, even when electromagnetic waves generated from electronic devices and the like are transmitted to the organic light emitting layer, the performance may be deteriorated, and the electromagnetic waves also adversely affect the user of the device.

Patent Document 1 discloses a structure that a buffer member made of urethane or the like is disposed under the substrate of the organic light emitting device to respond to an external impact problem.

However, the structure disclosed in Patent Document 1 is insufficient to ensure sufficient impact resistance when applied to a mobile device or the like.

In addition, in the structure disclosed in Patent Document 1, there is no consideration of electromagnetic waves or heat generated in the device.

In order to solve the electromagnetic wave or heat problem, it may also be considered to add a member capable of additionally shielding the electromagnetic wave or a member capable of solving the heat issue to the device, but the introduction of such a member makes it difficult to configure a device with a thin thickness.

PRIOR ART DOCUMENTS

Patent Documents (Patent Document 1) Korean Patent Publication No. 10-0965251

EXPLANATION OF REFERENCE NUMERALS

Figures 1, 2, 3:
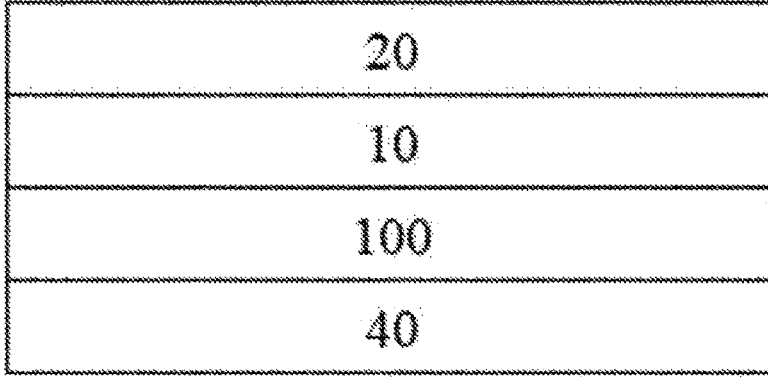
FIG. 1 is an exemplary diagram showing the structure of a conventional OLED.
FIGS. 2 and 3 are diagrams exemplarily showing the OLED of the present disclosure.

10: substrate
20: organic light emitting layer
30, 40: electronic element
100: buffer film

DISCLOSURE

Technical Problem

The present disclosure is intended to provide a buffer film and a use thereof, and particularly, intended to provide a buffer film for an organic light emitting device and a use thereof.

Technical Solution

Among physical properties mentioned in this specification, the physical properties in which the measurement temperature affects the results are results measured at room temperature, unless otherwise specified.

The term room temperature is a natural temperature without warming or cooling, which means, for example, any one temperature within a range of 10° C. to 30° C., or a temperature of about 23° C. or about 25° C. or so. In addition, in this specification, the unit of temperature is Celsius (° C.), unless otherwise specified.

Among physical properties mentioned in this specification, the properties in which the measurement pressure affects the results are results measured at normal pressure, unless otherwise specified.

The term normal pressure is a natural pressure that is not controlled in a manner such as pressurization and depressurization, and usually at atmospheric pressure, which may be a pressure of about 900 hPa to 1,200 hPa or so.

In the case of a physical property in which the measurement humidity affects the result, the relevant physical property is a physical property measured at natural humidity that is not specifically controlled under room temperature and normal pressure conditions.

The present disclosure provides a buffer film. The buffer film of the present disclosure may be applied to various uses requiring mitigation of impacts. In one example, the buffer film may be effectively used for an organic light emitting device (hereinafter, OLED).

The buffer film of the present disclosure comprises a porous metal sheet. The term porous metal sheet means a metal sheet having one or more or two or more voids formed therein or on the surface, where the metal sheet has a shape commonly referred to as a film, sheet or layer.

The porous metal sheet comprises a metal as a main component. Therefore, the weight ratio of the metal based on the total weight of the porous metal sheet may be 55 weight % or more, 60 weight % or more, 65 weight % or more, 70 weight % or more, 75 weight % or more, 80 weight % or more, 85 weight % or more, 90 weight % or more, or 95 weight % or more or so. Since the porous metal sheet may comprise only the metal, the upper limit of the weight ratio of the metal is 100 weight %. Here, the category of metals also includes so-called metal alloys. In addition, the metal may also be included in the form of an oxide, nitride or oxynitride in the porous metal sheet.

The porous metal sheet may exhibit an effect of buffering external impacts due to a structure including pores. Also, by securing the heat conduction properties required in the device through the selection of the metal material applied to the porous metal sheet, it is possible to secure a heat dissipation effect. In addition, the voids included in the porous metal sheet may also exhibit an effect of dissipating or shielding electromagnetic waves. Accordingly, the buffer film of the present disclosure may exhibit heat dissipation properties, electromagnetic wave shielding properties, impact resistance and impact mitigation properties required for devices with only the porous metal sheet. Therefore, the buffer film of the present disclosure enables to solve various problems that may occur in OLEDs and the like without price increase, process complexity and thickness increase.

The porous metal sheet included in the buffer film of the present disclosure may exhibit average reflectance of 50% or less for light in a wavelength range of 400 to 800 nm. In another example, the average reflectance may also be 49% or less, 47% or less, 45% or less, 43% or less, 41% or less, 39% or less, 37% or less, 35% or less, 33% or less, 31% or less, or 29% or less or so. Such low reflectance is especially necessary when the buffer film is applied for OLEDs. The OLED usually comprises a reflective electrode or a reflective plate for light emission, where such a reflective electrode or reflective plate reduces visibility of devices, so that various approaches for solving this have been made. When a metal material is applied to the buffer film, the above problem may be highlighted due to the inherent reflective properties of the metal. In the present disclosure, by adjusting the reflectance of the porous metal sheet as above, the buffer film can exhibit desired performance without reducing optical properties of OLEDs and the like.

The average reflectance of the porous metal sheet for light in a wavelength range of 400 to 800 nm is advantageous as the value is lowered, whereby the lower limit thereof is not particularly limited. Considering the reflective properties of a general metal material, for example, the average reflectance may be about 10% or more, 15% or more, or 25% or more or so.

The average reflectance is obtained by measuring the reflectance for each wavelength from 400 nm to 800 nm at 0.5 nm intervals, and averaging the values, and specifically, it is a value measured by the method presented in Examples.

A method of adjusting the reflectance of the porous metal sheet as above is not particularly limited. Intrinsic reflection properties exhibited by metal materials are known for each metal, and the above reflectance can be achieved by selecting an appropriate metal in consideration of such reflection properties. If necessary, two or more kinds of metals may be applied for adjusting the reflectance, as described below.

The porous metal sheet may also have specific resistance of $1.0 \times 10^{-5}$ Ωcm or more. The buffer film of the present disclosure may be included in electronic/electrical devices, such as OLED, in order to secure buffering properties, heat dissipation properties and/or electromagnetic wave shielding properties, and the like. At this time, when the specific resistance of the porous metal sheet is adjusted within the above range, an appropriate insulation site or energization site may be formed in the device through the porous metal sheet. Therefore, by adjusting the specific resistance of the porous metal sheet as above, the structure of the device to which the buffer film of the present disclosure is applied can be more simply and efficiently controlled. The measuring method of the specific resistance is described in the following Examples. The method of forming the porous metal sheet so that the above specific resistance can be achieved is not particularly limited. Since the intrinsic specific resistance of the metal material is known, an appropriate metal can be selected to form a porous metal sheet having the specific resistance in the above range. In order to impart heat dissipation properties to the porous metal sheet, it is advantageous to select a metal having preferably good thermal conductive properties, where the metal having good thermal conductive properties often exhibits low specific resistance. Therefore, in order to simultaneously secure excellent thermal conductive properties and specific resistance in the above range, it may be advantageous to configure the porous metal sheet using two or more kinds of metals. In another example, the specific resistance may be $1.1 \times 10^{-5}$ Ωcm or more, $1.2 \times 10^{-5}$ Ωcm or more, $1.3 \times 10^{-5}$ Ωcm or more, $1.4 \times 10^{-5}$ Ωcm or more, $1.5 \times 10^{-5}$ Ωcm or more, $1.6 \times 10^{-5}$ Ωcm or more, $1.7 \times 10^{-5}$ Ωcm or more, $1.8 \times 10^{-5}$ Ωcm or more, $1.9 \times 10^{-5}$ Ωcm or more, $2.0 \times 10^{-5}$ Ωcm or more, $2.1 \times 10^{-5}$ Ωcm or more, or $2.2 \times 10^{-5}$ Ωcm or more, or may also be $9 \times 10^{-5}$ Ωcm or less, $8 \times 10^{-5}$ Ωcm or less, $7 \times 10^{-5}$ Ωcm or less, $6 \times 10^{-5}$ Ωcm or less, $5 \times 10^{-5}$ Ωcm or less, $4 \times 10^{-5}$ Ωcm or less, $3 \times 10^{-5}$ Ωcm or less, $2 \times 10^{-5}$ Ωcm or less, or $1.5 \times 10^{-5}$ Ωcm or less or so.

The porous metal sheet may have thermal diffusivity of 25 mm$^2$/s or more. The thermal diffusivity is a value measured in the manner described in Examples of this specification. When the porous metal sheet has thermal diffusivity in the above range, the buffer film of the present disclosure may exhibit heat dissipation properties in devices such as OLEDs. In another example, the thermal diffusivity may be 30 mm$^2$/s or more, 35 mm$^2$/s or more, 40 mm$^2$/s or more, 45 mm$^2$/s or more, 50 mm$^2$/s or more, 55 mm$^2$/s or more, 60 mm$^2$/s or more, 65 mm$^2$/s or more, 70 mm$^2$/s or more, 75 mm$^2$/s or more, 80 mm$^2$/s or more, 85 mm$^2$/s or more, 90 mm$^2$/s or more, 95 mm$^2$/s or more, 100 mm$^2$/s or more, 105 mm$^2$/s or more, 110 mm$^2$/s or more, 115 mm$^2$/s or more, 120 mm$^2$/s or more, 125 mm$^2$/s or more, 130 mm$^2$/s or more, 135 mm$^2$/s or more, 140 mm$^2$/s or more, 145 mm$^2$/s or more, 150 mm$^2$/s or more, 155 mm$^2$/s or more, 160 mm$^2$/s or more, 165 mm$^2$/s or more, 170 mm$^2$/s or more, 175 mm$^2$/s or more, 180 mm$^2$/s or more, 185 mm$^2$/s or more, 190 mm$^2$/s or more, 195 mm$^2$/s or more, 200 mm$^2$/s or more, 205 mm$^2$/s or more, 210 mm$^2$/s or more, 215 mm$^2$/s or more, 220 mm$^2$/s or more, 225 mm$^2$/s or more, 230 mm$^2$/s or more, 235 mm$^2$/s or more, 240 mm$^2$/s or more, 245 mm$^2$/s or more, 250 mm$^2$/s or more, 255

5 mm²/s or more, 260 mm²/s or more, 265 mm²/s or more, 270 mm²/s or more, 275 mm²/s or more, 280 mm²/s or more, 285 mm²/s or more, 290 mm²/s or more, or 295 mm²/s or more or so, or may also be 300 mm²/s or less, 295 mm²/s or less, 290 mm²/s or less, 285 mm²/s or less, 280 mm²/s or less, 275 mm²/s or less, 270 mm²/s or less, 265 mm²/s or less, 260 mm²/s or less, 255 mm²/s or less, 250 mm²/s or less, 245 mm²/s or less, 240 mm²/s or less, 235 mm²/s or less, 230 mm²/s or less, 225 mm²/s or less, 220 mm²/s or less, 215 mm²/s or less, 210 mm²/s or less, 205 mm²/s or less, 200 mm²/s or less, 195 mm²/s or less, 190 mm²/s or less, 185 mm²/s or less, 180 mm²/s or less, 175 mm²/s or less, 170 mm²/s or less, 165 mm²/s or less, 160 mm²/s or less, 155 mm²/s or less, 150 mm²/s or less, 145 mm²/s or less, 140 mm²/s or less, 135 mm²/s or less, 130 mm²/s or less, 125 mm²/s or less, 120 mm²/s or less, 115 mm²/s or less, 110 mm²/s or less, 105 mm²/s or less, 100 mm²/s or less, 95 mm²/s or less, 90 mm²/s or less, 85 mm²/s or less, 80 mm²/s or less, 75 mm²/s or less, 70 mm²/s or less, 65 mm²/s or less, 60 mm²/s or less, 55 mm²/s or less, 50 mm²/s or less, 45 mm²/s or less, or 40 mm²/s or less or so.

Such thermal diffusivity can be achieved by configuring the porous metal sheet using an appropriate metal material in consideration of the thermal conductive properties of the metal material for each material. In the aspect that the above-described reflectance, thermal conductive properties and specific resistance can be simultaneously achieved, the porous metal sheet may be configured using two or more kinds of metals as will be described below.

The porous metal sheet included in the buffer film has the form of a film, sheet or layer, as described above. The porous metal sheet having such a form may have a first major surface and a second major surface opposite thereto. Here, among the surfaces confirmed in the porous metal sheet in the form of the film, sheet or layer, the first and second major surfaces are two surfaces having a large area compared to other surfaces, and such first and second major surfaces are usually opposite to each other.

The first and second major surfaces may have different surface roughness. By varying the surface roughness of the first and second major surfaces of the porous metal sheet, the buffering properties and durability of the device can be further improved. For example, when the buffer film of the present disclosure is applied to an OLED, the buffer film may be applied in contact with the surface opposite to the surface of the substrate forming an organic light emitting layer thereon, on which the organic light emitting layer is formed, as will be described below. At this time, when the buffer film is disposed so that a surface having larger surface roughness among the first and second major surfaces of the porous metal sheet (hereinafter, it is assumed that the first major surface has larger surface roughness) faces the organic light emitting layer, a better impact mitigation effect can be obtained. Although not limited by theory, the reason for obtaining this effect is estimated as follows. In general, the impact to be alleviated among the impacts applied to the OLED is an impact applied in the direction of the substrate from the organic light emitting layer. Therefore, when the buffer film is disposed so that the first major surface of the first and second major surfaces faces the organic light emitting layer, the impact is first applied to the first major surface of the first and second major surfaces, and the applied impact is transmitted in a direction from the first major surface to the second major surface. At this time, if the surface roughness of the first major surface to which the impact is first applied is large, the impact may be efficiently absorbed compared to the case where the surface roughness is small. In addition, the applied impact is transmitted to the second major surface and then dispersed, where if the second major surface on which the impact is dispersed exhibits relatively small surface roughness, the impact can be more effectively dispersed.

Also, in order to arrange the buffer film as above, a sticking layer, which will be described below, is attached to the porous metal sheet, where the sticking layer should be formed on the first major surface having larger surface roughness for arrangement of such a buffer film. At this time, since the first major surface has large surface roughness, it is possible to exhibit better adhesiveness to the sticking layer by a so-called anchoring effect or the like, and as a result, the durability of the device can be improved.

The degree of difference in the surface roughness of the first and second major surfaces is not particularly limited, but in order to properly secure the above effect, the ratio 1Sa/2Sa of the surface roughness (1Sa) of the first major surface to the surface roughness (2Sa) of the second major surface may be adjusted to be more than 1 and 3 or less. In another example, the ratio 1Sa/2Sa may be 1.05 or more, 1.1 or more, 1.15 or more, 1.2 or more, 1.25 or more, 1.3 or more, 1.35 or more, 1.4 or more, 1.45 or more, 1.5 or more, 1.55 or more, 1.6 or more, 1.65 or more, or 1.7 or more, or may also be 2.9 or less, 2.8 or less, 2.7 or less, 2.6 or less, 2.5 or less, 2.4 or less, 2.3 or less, 2.2 or less, 2.1 or less, 2.0 or less, 1.9 or less, 1.8 or less, 1.7 or less, 1.6 or less, 1.5 or less, 1.4 or less, 1.3 or less, or 1.2 or less or so.

Under such a ratio, the surface roughness (1Sa) of the first major surface may be 6.5 μm or more. In another example, the surface roughness (1Sa) may be 6.7 μm or more, 6.9 μm or more, 7.1 μm or more, 7.3 μm or more, 7.5 μm or more, 7.7 μm or more, 7.9 μm or more, 8.1 μm or more, 8.3 μm or more, 8.5 μm or more, or 8.7 μm or more or so, or may also be 20 μm or less, 18 μm or less, 16 μm or less, 14 μm or less, 12 μm or less, 10 μm or less, or 8 μm or less or so.

The method for measuring the surface roughness for the first and second major surfaces is described in the Examples section.

The method for controlling the surface roughness of both surfaces of the porous metal sheet as above is not particularly limited. As described below, in the present disclosure, a metal foam, a metal fiber sintered sheet or a metal mesh, and the like may be used as the porous metal sheet. Here, the metal foam may be prepared by preparing a precursor using a slurry comprising a metal powder and sintering it. For example, in the above process, the surface roughness may be controlled by adjusting the particle diameter of the metal powder in the slurry. Also, in the metal fiber sintered sheet, the surface roughness can also be controlled by controlling the wire diameter of the applied metal fiber, and in the case of the metal mesh, the surface roughness can also be adjusted through the control of the mesh size or the like. In addition, there is no particular limitation on the method of varying the surface roughness of the first and second major surfaces. In the manufacturing process of the metal foam or metal fiber sintered sheet among the porous metal sheets, a sintering process for the precursor may be performed. At this time, the precursor may also be in the form of a film, sheet or layer, where in the procedure of performing the sintering process, one major surface of the film, sheet or layer contacts a relatively smooth surface, and the sintering is performed in a state that the opposite surface is exposed to air, or the sintering is performed in a state that the opposite surface is in contact with the surface having roughness, whereby a porous metal sheet having different surface roughness on both major surfaces is obtained. In addition, without or with using the above method, if it is necessary to adjust the surface roughness of the major surface of the manufactured porous metal sheet, the surface roughness of the porous metal sheet can be adjusted by applying the method of pressing the surface of the porous metal sheet, or the like.

The porous metal sheet of the buffer film of the present disclosure may have an electromagnetic wave shielding ability. Among metals, conductive metals may exhibit reflective properties to electromagnetic waves. Therefore, the electromagnetic wave propagated to the buffer film may be reflected and shielded by the porous metal sheet. In addition, since the porous metal sheet includes voids therein or on the surface, electromagnetic waves that have once propagated to the porous metal sheet may be repeatedly reflected within the voids, and the electromagnetic waves may be dissipated by interference or the like in the process.

In one example, the porous metal sheet may have an electromagnetic wave shielding property of 70 dB or more at 30 MHz to 1.5 GHz. In another example, the electromagnetic shielding property may be 75 dB or more, 80 dB or more, 85 dB or more, 86 dB or more, 87 dB or more, 88 dB or more, 89 dB or more, 90 dB or more, 91 dB or more, 92 dB or more, 93 dB or more, 94 dB or more, or 95 dB or more. The upper limit of the electromagnetic wave shielding property is not particularly limited, but for example, it may be about 200 dB or less, 190 dB or less, 180 dB or less, 170 dB or less, 160 dB or less, 150 dB or less, 140 dB or less, 130 dB or less, 120 dB or less, 100 dB or less, or 100 dB or less or so. Such an electromagnetic shielding property can be achieved by adjusting the pore properties, thickness and material of the porous metal sheet as follows. The electromagnetic wave shielding property may be measured according to ASTM D4935 or ASTM ES7 standard.

For securing the required impact resistance and implementing the above-described electromagnetic wave shielding ability and heat dissipation characteristics, it is possible to control the thickness of the porous metal sheet. For example, the thickness of the porous metal sheet may be 50 μm or more, 65 μm or more, 70 μm or more, 75 μm or more, 80 μm or more, 85 μm or more, 90 μm or more, 95 μm or more, 100 μm or more, 105 μm or more, 110 μm or more, 115 μm or more, 120 μm or more, 125 μm or more, 130 μm or more, 135 μm or more, 140 μm or more, 145 μm or more, 150 μm or more, 155 μm or more, 160 μm or more, 165 μm or more, 170 μm or more, 175 μm or more, 180 μm or more, 185 μm or more, 190 μm or more, 195 μm or more, or 200 μm or more or so. As the thickness of the porous metal sheet increases, it is advantageous in securing heat dissipation properties, electromagnetic wave shielding properties and impact resistance required for OLEDs and the like, so that the upper limit of the thickness is not particularly limited. However, when the porous metal sheet is too thick, it is disadvantageous to implement a thin device, so that the thickness of the porous metal sheet may be controlled in a range of about 1000 μm or less, 900 μm or less, 800 μm or less, 700 μm or less, 600 μm or less, 500 μm or less, 400 μm or less, 300 μm or less, 200 μm or less, or 150 μm or less.

The porous metal sheet may be formed using various known metals or metal alloys. The porous metal sheet exhibiting the above-described properties can be obtained by selecting an appropriate material in consideration of reflectance, thermal conductive properties and electric conduction properties of the metal material.

For example, the porous metal sheet may comprise any one metal selected from the group consisting of stainless steel, copper, gold, platinum, silver, aluminum, nickel, manganese, iron, cobalt, magnesium, molybdenum, tungsten and zinc, or two or more of the foregoing, or may be constructed therefrom, but is not limited thereto.

In the porous metal sheet, the content of any one metal selected from the group consisting of stainless steel, copper, gold, platinum, silver, aluminum, nickel, manganese, iron, cobalt, magnesium, molybdenum, tungsten and zinc, or two or more of the foregoing may be 55 weight % or more, 60 weight % or more, 65 weight % or more, 70 weight % or more, 75 weight % or more, 80 weight % or more, 85 weight % or more, 90 weight % or more, or 95 weight % or more or so, based on the total weight of the porous metal sheet. Since the porous metal sheet may comprise only the metal, the upper limit of the weight ratio of the metal is 100 weight %.

In one example, the porous metal sheet may comprise a first metal and a second metal different from the first metal.

In one example, the first and second metals may have Young's moduli in different ranges.

For example, the Young's modulus of the first metal may be 160 GPa or less, and the Young's modulus of the second metal may be more than 160 GPa. The Young's modulus of the metal is a value identified according to ASTM E111.

In another example, the Young's modulus of the first metal may be 155 GPa or less, 150 GPa or less, 145 GPa or less, 140 GPa or less, 135 GPa or less, 130 GPa or less, 125 GPa or less, 120 GPa or less, 115 GPa or less or so, or may also be 50 GPa or more, 55 GPa or more, 60 GPa or more, 65 GPa or more, 70 GPa or more, 75 GPa or more, 80 GPa or more, 85 GPa or more, 90 GPa or more, 95 GPa or more, 100 GPa or more, 105 GPa or more, 110 GPa or more, 115 GPa or more, 120 GPa or more, or 125 GPa or more or so.

In another example, the Young's modulus of the second metal may be 165 GPa or more, 170 GPa or more, 175 GPa or more, 180 GPa or more, 185 GPa or more, 190 GPa or more, 195 GPa or more, or 200 GPa or more or so, or may also be 400 GPa or less, 395 GPa or less, 390 GPa or less, 385 GPa or less, 380 GPa or less, 375 GPa or less, 370 GPa or less, 365 GPa or less, 360 GPa or less, 355 GPa or less, 350 GPa or less, 345 GPa or less, 340 GPa or less, 335 GPa or less, 330 GPa or less, 325 GPa or less, 320 GPa or less, 315 GPa or less, 310 GPa or less, 305 GPa or less, 300 GPa or less, 295 GPa or less, 290 GPa or less, 285 GPa or less, 280 GPa or less, 275 GPa or less, 270 GPa or less, 265 GPa or less, 260 GPa or less, 255 GPa or less, 250 GPa or less, 245 GPa or less, 240 GPa or less, 235 GPa or less, 230 GPa or less, 225 GPa or less, 220 GPa or less, 215 GPa or less, 210 GPa or less, or 205 GPa or less or so.

By applying the first and second metals each having the above Young's modulus, it is possible to obtain a porous metal sheet in which a desired impact mitigation property is efficiently secured.

In one example, the first and second metals may have specific resistances in different ranges.

For example, the first metal may have specific resistance of $4.3\times10^{-6}$ Ωcm or less, and the second metal may have specific resistance of more than $4.3\times10^{-6}$ Ωcm. The specific resistance of the metal is a value identified according to ASTM E1004-17.

In another example, the specific resistance of the first metal may be $4.1\times10^{-6}$ Ωcm or less, $3.9\times10^{-6}$ Ωcm or less, $3.7\times10^{-6}$ Ωcm or less, $3.5\times10^{-6}$ Ωcm or less, $3.3\times10^{-6}$ Ωcm or less, $3.1\times10^{-6}$ Ωcm or less, $2.9\times10^{-6}$ Ωcm or less, $2.7\times10^{-6}$ Ωcm or less, $2.5\times10^{-6}$ Ωcm or less, $2.3\times10^{-6}$ Ωcm or less, $2.1\times10^{-6}$ Ωcm or less, $1.9\times10^{-6}$ Ωcm or less, or $1.7\times10^{-6}$ Ωcm or less or so, or may also be $0.5\times10^{-6}$ Ωcm or more, $0.7\times10^{-6}$ Ωcm or more, $0.9\times10^{-6}$ Ωcm or more, $1.0 \times 10^{-6}$ Ωcm or more, $1.1 \times 10^{-6}$ Ωcm or more, $1.3 \times 10^{-6}$ Ωcm or more, $1.5 \times 10^{-6}$ Ωcm or more, or $1.7 \times 10^{-6}$ Ωcm or more or so.

In another example, the specific resistance of the second metal may be $4.5 \times 10^{-6}$ Ωcm or more, $4.9 \times 10^{-6}$ Ωcm or more, $5.1 \times 10^{-6}$ Ωcm or more, $5.3 \times 10^{-6}$ Ωcm or more, $5.5 \times 10^{-6}$ Ωcm or more, $5.7 \times 10^{-6}$ Ωcm or more, $5.9 \times 10^{-6}$ Ωcm or more, $6.1 \times 10^{-6}$ Ωcm or more, $6.3 \times 10^{-6}$ Ωcm or more, $6.5 \times 10^{-6}$ Ωcm or more, $6.7 \times 10^{-6}$ Ωcm or more, or $6.9 \times 10^{-6}$ Ωcm or more or so, or may also be $15 \times 10^{-6}$ Ωcm or less, $14 \times 10^{-6}$ Ωcm or less, $13 \times 10^{-6}$ Ωcm or less, $12 \times 10^{-6}$ Ωcm or less, $11 \times 10^{-6}$ Ωcm or less, $10 \times 10^{-6}$ Ωcm or less, $9.9 \times 10^{-6}$ Ωcm or less, $9.7 \times 10^{-6}$ Ωcm or less, $9.5 \times 10^{-6}$ Ωcm or less, $9.3 \times 10^{-6}$ Ωcm or less, $9.1 \times 10^{-6}$ Ωcm or less, $8.9 \times 10^{-6}$ Ωcm or less, $8.7 \times 10^{-6}$ Ωcm or less, $8.5 \times 10^{-6}$ Ωcm or less, $8.3 \times 10^{-6}$ Ωcm or less, $8.1 \times 10^{-6}$ Ωcm or less, $7.9 \times 10^{-6}$ Ωcm or less, $7.7 \times 10^{-6}$ Ωcm or less, $7.5 \times 10^{-6}$ Ωcm or less, $7.3 \times 10^{-6}$ Ωcm or less, $7.1 \times 10^{-6}$ Ωcm or less, or $6.9 \times 10^{-6}$ Ωcm or less or so.

Through the application of the first and second metals each having specific resistance in such a range, a porous metal sheet having simultaneously desired thermal conductive properties and electrical resistance properties can be more effectively formed.

In one example, the first and second metals may have different ranges of thermal conductivities.

For example, the first metal may have a thermal conductivity of 150 W/mK or more, and the second metal may have a thermal conductivity of less than 150 W/mK. The thermal conductivity of the metal is a value identified according to ASTM E1225.

In another example, the thermal conductivity of the first metal may be 1000 W/mK or less, 950 W/mK or less, 900 W/mK or less, 850 W/mK or less, 800 W/mK or less, 750 W/mK or less, 700 W/mK or less, 650 W/mK or less, 600 W/mK or less, 550 W/mK or less, 500 W/mK or less, or 450 W/mK or less or so, or may also be 160 W/mK or more, 170 W/mK or more, 180 W/mK or more, 190 W/mK or more, 200 W/mK or more, 210 W/mK or more, 220 W/mK or more, 230 W/mK or more, 240 W/mK or more, 250 W/mK or more, 260 W/mK or more, 270 W/mK or more, 280 W/mK or more, 290 W/mK or more, 300 W/mK or more, 310 W/mK or more, 320 W/mK or more, 330 W/mK or more, 340 W/mK or more, 350 W/mK or more, 360 W/mK or more, 370 W/mK or more, 380 W/mK or more, 390 W/mK or more, or 400 W/mK or more or so.

In another example, the thermal conductivity of the second metal may be 10 W/mK or more, 20 W/mK or more, 30 W/mK or more, 40 W/mK or more, 50 W/mK or more, 60 W/mK or more, 70 W/mK or more, 80 W/mK or more, or 90 W/mK or more or so, or may also be 145 W/mK or less, 140 W/mK or less, 135 W/mK or less, 130 W/mK or less, 125 W/mK or less, 120 W/mK or less, 115 W/mK or less, 110 W/mK or less, 105 W/mK or less, 100 W/mK or less, or 95 W/mK or less or so.

Through the application of the first and second metals each having a thermal conductivity in such a range, a porous metal sheet having simultaneously desired thermal conductive properties and electrical resistance properties can be more effectively formed.

The first metal may exhibit at least one characteristic selected from the group consisting of the aforementioned Young's modulus, thermal conductivity and specific resistance, and in one example, it may simultaneously exhibit the Young's modulus, thermal conductivity and specific resistance. The type of such a metal is not particularly limited, and, for example, the first metal may be copper.

The second metal may exhibit at least one characteristic selected from the group consisting of the aforementioned Young's modulus, thermal conductivity and specific resistance, and in one example, it may simultaneously exhibit the Young's modulus, thermal conductivity and specific resistance. The type of such a metal is not particularly limited, and, for example, the second metal may be copper.

In addition, only one type of the first metal may be included in the porous metal sheet, and two or more types of the first metals may also be present in the porous metal sheet. For example, even if two or more types of metals having the Young's modulus in the above-described range based on the Young's modulus but being different kinds from each other are present, the two or more types of metals are regarded as the first metal as long as the Young's modulus is within the above-described range. This classification is the same for the specific resistance or thermal conductivity.

Only one type of the second metal may be included in the porous metal sheet, and two or more types of the second metals may also be present in the porous metal sheet. For example, even if two or more types of metals having the Young's modulus in the above-described range based on the Young's modulus but being different kinds from each other are present, the two or more types of metals are regarded as the second metal as long as the Young's modulus is within the above-described range. This classification is the same for the specific resistance and thermal conductivity.

The total weight ratio of the first and second metals in the porous metal sheet may be 55 weight % or more, 60 weight % or more, 65 weight % or more, 70 weight % or more, 75 weight % or more, 80 weight % or more, 85 weight % or more, 90 weight % or more, or 95 weight % or more or so, based on the total weight of the porous metal sheet. Since the porous metal sheet may comprise only the first and second metals, the upper limit of the total weight ratio of the first and second metals is 100 weight %.

The first and second metals may have different thermal conductivities, specific resistance and/or Young's moduli as described above, and simultaneously exhibit densities in similar ranges. The density of the metal is a value identified according to ASTM B923.

For example, the densities of the first and second metals may each be in a range of 6 to 15 g/cm³. In another example, the density may be 6.5 g/cm³ or more, 7 g/cm³ or more, 7.5 g/cm³ or more, 8 g/cm³ or more, or 8.5 g/cm³ or more, or may also be 14.5 g/cm³ or less, 14 g/cm³ or less, 13.5 g/cm³ or less, 13 g/cm³ or less, 12.5 g/cm³ or less, 12 g/cm³ or less, 11.5 g/cm³ or less, 11 g/cm³ or less, 10.5 g/cm³ or less, or 10 g/cm³ or less or so.

Through the application of a metal having a density in such a range, it is possible to manufacture a buffer film that is lighter and secures a desired effect.

The first and second metals may have different thermal conductivities, specific resistance and/or Young's moduli as described above, and simultaneously exhibit Poisson ratios in similar ranges. The Poisson ratio of the metal is a value identified according to ASTM E132.

For example, Poisson ratios of the first and second metals may each be in a range of 0.1 to 0.7. In another example, the Poisson ratio may be about 0.15 or more, 0.2 or more, 0.25 or more, or 0.3 or more, or may also be 0.65 or less, 0.6 or less, 0.55 or less, 0.5 or less, 0.45 or less, 0.4 or less, or 0.35 or less or so.

Through the application of a metal having a Poisson ratio in such a range, it is possible to more efficiently manufacture a buffer film exhibiting a desired impact mitigation effect.

The first and second metals may each independently satisfy either or both of the above-described density and Poisson ratio.

The ratio between the first and second metals in the porous metal sheet is not particularly limited. That is, since the above-described reflectance, specific resistance and thermal conductive properties of the porous metal sheet depend on the contents of the first and second metals, the content ratio of the first and second metals may be adjusted to satisfy the above-described reflectance, specific resistance and thermal conductive properties.

There is no limitation on a method of simultaneously comprising the first and second metals in the porous metal sheet. For example, as described below, the porous metal sheet may be a metal foam, a metal fiber sintered sheet or a metal mesh, where the first and second metals may be used simultaneously as the material of the metal foam, metal fiber sintered sheet or metal mesh, and the like. Alternatively, a method of forming the metal foam, the metal fiber sintered sheet or the metal mesh with any one of the first and second metals, and then forming a metal layer with the other metal on the metal foam, the metal fiber sintered sheet or the metal mesh may also be applied. Here, the method of forming a metal layer is not particularly limited, and, for example, a known method such as electrolytic plating or electroless plating may be applied.

In one example, the porous metal sheet may be a so-called metal foam. As the metal foam, a known metal foam may be used without particular limitation as long as it is made of the above-described materials and exhibits the above-mentioned properties (specific resistance, thermal conductivity, reflectance, etc.).

These metal foams are known variously, and the methods of manufacturing the metal foam are also known variously. In the present disclosure, such a known metal foam, or a metal foam manufactured by a known method may be applied.

The metal foam applied in the present disclosure may be formed, for example, by a method comprising the step of sintering the metal foam precursor containing the above-described metal. In the present disclosure, the term metal foam precursor means a structure before a process performed to form a metal foam, such as the sintering, that is, a structure before the metal foam is generated. Even if the metal foam precursor is called a porous metal foam precursor, it does not necessarily have to be porous by itself, and as long as it may finally form a metal foam that is a porous metal structure, it may be called a porous metal foam precursor for convenience.

The metal foam precursor may be formed using a slurry comprising at least a metal component, a dispersant or a solvent, and a binder, where a porous metal sheet having desired properties may be efficiently manufactured through the application of the slurry.

A metal powder may be applied as the metal component. An example of the applicable metal powder is determined depending on the purpose, without being particularly limited, and for example, the powder of the first and/or second metal as described above or the powder of a metal alloy or the powder of a mixture of metals may be applied.

The size of the metal powder is also selected in consideration of the desired porosity or surface roughness, and the like, without being particularly limited, but for example, the average particle diameter of the metal powder may be in a range of about 0.1 μm to about 200 μm. In another example, the average particle diameter may be about 0.5 μm or more, about 1 μm or more, about 2 μm or more, about 3 μm or more, about 4 μm or more, about 5 μm or more, about 6 μm or more, about 7 μm or more, or about 8 μm or more, 10 μm or more, 15 μm or more, 20 μm or more, 25 μm or more, 30 μm or more, 35 μm or more, 40 μm or more, 45 μm or more, 50 μm or more, or 55 μm or more. In another example, the average particle diameter may be about 150 μm or less, 100 μm or less, 90 μm or less, 80 μm or less, 70 μm or less, 60 μm or less, 50 μm or less, 40 μm or less, 30 μm or less, or 20 μm or less. As metals in metal particles, those having different average particle diameters from each other may also be applied. The average particle diameter may be selected in an appropriate range in consideration of the desired shape of the metal foam, for example, the thickness or porosity of the metal foam, and the like. The average particle diameter of the metal powder referred to in this specification is a so-called median particle diameter, also called a D50 particle diameter. Such a median particle diameter can be obtained by a well-known particle size analysis method.

The ratio of the metal component (metal powder) in the slurry is not particularly limited, which may be selected in consideration of a desired viscosity or process efficiency, and the like. In one example, the ratio of the metal component in the slurry may be 0.5 to 95% or so on a weight basis, but is not limited thereto. In another example, the ratio may be about 1% or more, about 1.5% or more, about 2% or more, about 2.5% or more, about 3% or more, about 5% or more, 10% or more, 15% or more, 20% or more, 25% or more, 30% or more, 35% or more, 40% or more, 45% or more, 50% or more, 55% or more, 60% or more, 65% or more, 70% or more, 75% or more, or 80% or more, or may be about 90% or less, about 85% or less, about 80% or less, about 75% or less, about 70% or less, about 65% or less, 60% or less, 55% or less, 50% or less, 45% or less, 40% or less, 35% or less, 30% or less, 25% or less, 20% or less, 15% or less, 10% or less, or 5% or less or so, but is not limited thereto.

The metal foam precursor may be formed using a slurry comprising a dispersant or a solvent and a binder together with the metal powder.

As the dispersant or solvent, for example, an alcohol may be applied. As the alcohol, a monohydric alcohol with 1 to 20 carbon atoms such as methanol, ethanol, propanol, pentanol, octanol, 2-methoxyethanol, 2-ethoxyethanol, 2-butoxyethanol or terpineol, or a dihydric alcohol with 1 to 20 carbon atoms such as ethylene glycol, propylene glycol, hexanediol, octanediol or pentanediol, or a higher polyhydric alcohol with 1 to 20 carbon atoms such as glycerol or texanol, and the like may be used, but the kind is not limited to the above. In addition, as the other solvent, an appropriate solvent may be used in consideration of the solubility of the metal component and the binder to be described below, where a solvent having a dielectric constant in a range of about 10 to 120 may be used and in another example, the dielectric constant may be about 20 or more, about 30 or more, about 40 or more, about 50 or more, about 60 or more, or about 70 or more, or may be about 110 or less, about 100 or less, or about 90 or less. Such a solvent can be exemplified by water or an alcohol with 1 to 8 carbon atoms such as ethanol, butanol or methanol, DMSO (dimethyl sulfoxide), DMF (dimethylformamide) or NMP (N-methylpyrrolidinone), and the like, or an ester-based solvent such as alkyl isobutyrate having an alkyl group with 1 to 20 carbon atoms, 1 to 16 carbon atoms, 1 to 12 carbon atoms, 1 to 8 carbon atoms or 1 to 4 carbon atoms, such as IBIB (isobutyl isobutyrate), and the like, but is not limited thereto.

A mixed solvent of the alcohol and the ester-based solvent may also be used as the solvent or dispersant. In this case, for example, about 1 to 100 parts by weight of the ester-based solvent may be used relative to 100 parts by weight of the alcohol. In another example, the ratio of the ester-based solvent may be 3 parts by weight or more, 5 parts by weight or more, 7 parts by weight or more, 9 parts by weight or more, or 11 parts by weight or more, or may be 90 parts by weight or less, 80 parts by weight or less, 70 parts by weight or less, 60 parts by weight or less, 50 parts by weight or less, 40 parts by weight or less, 30 parts by weight or less, or 20 parts by weight or less or so.

The slurry may further comprise a binder. The kind of such a binder is not particularly limited, which may be appropriately selected depending on the kind of the metal component, solvent, or dispersant applied upon producing the slurry. For example, the binder can be exemplified by alkylcellulose having an alkyl group with 1 to 8 carbon atoms such as methylcellulose or ethylcellulose, polyalkylene carbonate having an alkylene unit with 1 to 8 carbon atoms such as polypropylene carbonate or polyethylene carbonate, or a polyvinyl alcohol-based binder such as polyvinyl alcohol or polyvinyl acetate (hereinafter, may also be referred to as a polyvinyl alcohol compound), and the like, but is not limited thereto.

The ratio of each component in the slurry is not particularly limited. Such a ratio can be adjusted in consideration of the process efficiency such as coating property and moldability at the time of performing the process using the slurry.

For example, the binder may be contained in the slurry in a ratio of about 1 to 500 parts by weight relative to 100 parts by weight of the above-described metal component in order to more effectively ensure pore characteristics such as the desired porosity, or surface roughness, and the like. In another example, the ratio may be about 2 parts by weight or more, about 3 parts by weight or more, about 4 parts by weight or more, about 5 parts by weight or more, about 6 parts by weight or more, about 7 parts by weight or more, about 8 parts by weight or more, about 9 parts by weight or more, about 10 parts by weight or more, about 20 parts by weight or more, about 30 parts by weight or more, about 40 parts by weight or more, about 50 parts by weight or more, about 60 parts by weight or more, about 70 parts by weight or more, about 80 parts by weight or more, about 90 parts by weight or more, about 100 parts by weight or more, about 110 parts by weight or more, about 120 parts by weight or more, about 130 parts by weight or more, about 140 parts by weight or more, about 150 parts by weight or more, about 200 parts by weight or more, or about 250 parts by weight or more, and may be about 450 parts by weight or less, about 400 parts by weight or less, about 350 parts by weight or less, about 300 parts by weight or less, about 250 parts by weight or less, about 200 parts by weight or less, about 150 parts by weight or less, about 100 parts by weight or less, about 50 parts by weight or less, about 40 parts by weight or less, about 30 parts by weight or less, about 20 parts by weight or less, about 10 parts by weight or less, about 8 parts by weight or less, or about 6 parts by weight or less or so.

The dispersant or solvent in the slurry may be contained in a ratio of about 0.5 to 2,000 parts by weight relative to 100 parts by weight of the binder in order to more effectively secure the desired pore characteristics and the like. In another example, the ratio may be about 1 part by weight or more, about 1.5 parts by weight or more, about 5 parts by weight or more, about 10 parts by weight or more, about 15 parts by weight or more, about 20 parts by weight or more, about 30 parts by weight or more, about 40 parts by weight or more, about 50 parts by weight or more, about 60 parts by weight or more, about 70 parts by weight or more, about 80 parts by weight or more, about 90 parts by weight or more, about 100 parts by weight or more, about 200 parts by weight or more, about 300 parts by weight or more, about 400 parts by weight or more, about 500 parts by weight or more, about 550 parts by weight or more, about 600 parts by weight or more, or about 650 parts by weight or more, and may be about 1,800 parts by weight or less, about 1,600 parts by weight or less, about 1,400 parts by weight or less, 1,200 parts by weight or less or about 1,000 parts by weight or less, about 900 parts by weight or less, about 800 parts by weight or less, about 700 parts by weight or less, about 600 parts by weight or less, about 500 parts by weight or less, about 400 parts by weight or less, about 300 parts by weight or less, about 200 parts by weight or less, about 150 parts by weight or less, about 130 parts by weight or less, about 110 parts by weight or less, about 100 parts by weight or less, about 50 parts by weight or less, about 30 parts by weight or less, about 20 parts by weight or less, about 10 parts by weight or less, or about 5 parts by weight or less.

Unless otherwise specified, the unit weight part herein means a weight ratio between the respective components.

The slurry may also further comprise necessary known additives in addition to the above-mentioned components. However, in order to effectively obtain the desired pore characteristics or surface roughness, and the like, the slurry may not contain a so-called foaming agent. The term foaming agent includes components which can exhibit a foaming effect in relation to other components in the slurry, as well as components commonly referred to in the industry as blowing agents other. Therefore, in the present disclosure, the foaming process may not proceed during the process of manufacturing the metal foam.

The kinds of the additional components that can be included in the slurry vary, but a representative example can be exemplified by polymer beads which are a pore-forming agent. These polymer beads are present in the slurry, and then form pores in the regions existing in the slurry while being removed in the sintering process or the like. The kind of the applicable polymer beads is not particularly limited, where beads capable of being removed in the sintering process (for example, polymer beads having a melting point of the sintering temperature or less), and having an average particle diameter suitable for the desired pore size, may be used.

In addition, the slurry may also further comprise additives known to be capable of serving as a so-called leveling agent.

The method of forming the metal foam precursor using the slurry is not particularly limited. In the field of manufacturing metal foams, various methods for forming metal foam precursors are known, and in the present disclosure, all these methods can be applied. For example, the metal foam precursor can be formed by maintaining the slurry in a suitable template, or by coating the slurry in an appropriate manner.

It may be advantageous to apply a coating process when producing metal foams in the form of films or sheets according to one example of the present disclosure. For example, after the slurry is coated on a suitable base material to form a precursor, the desired metal foam can be formed through a sintering process to be described below. In the above process, the surface roughness of the metal foam may also be controlled through the control of the smoothness of the base material surface on which the slurry is coated.

The form of the metal foam precursor is determined according to the desired metal foam, which is not particularly limited. In one example, the metal foam precursor may be in the form of a film, sheet or layer, as in the case of a porous metal sheet.

A suitable drying process may also be performed during the process of forming the metal foam precursor. For example, the metal foam precursor may also be formed by molding the slurry by the above-mentioned coating method or the like and then drying it for a certain time. The conditions of the drying are not particularly limited, which can be controlled, for example, at a level where the solvent contained in the slurry can be removed to a desired level. For example, the drying may be performed by maintaining the molded slurry at a temperature in a range of about 50° C. to 250° C., about 70° C. to 180° C., or about 90° C. to 150° C. for an appropriate period of time. The drying time can also be selected in an appropriate range.

The metal foam precursor formed in this manner can be sintered to produce a metal foam. In this case, the method of performing the sintering for producing the metal foam is not particularly limited, and a known sintering method can be applied. That is, the sintering can be performed in such a manner that an appropriate amount of heat is applied to the metal foam precursor in an appropriate manner.

In this case, the sintering conditions can be controlled such that the metal powder is connected to form a porous structure in consideration of the state of the applied metal foam precursor, for example, the composition of the slurry or the kind of the metal powder, and the like, and specific conditions are not particularly limited.

For example, the sintering can be performed by maintaining the precursor at a temperature in a range of about 500° C. to 2000° C., in a range of 700° C. to 1500° C. or in a range of 800° C. to 1200° C., and the holding time can also be selected optionally. In one example, the holding time may be in a range of about 1 minute to 10 hours or so, but is not limited thereto.

After forming the metal foam in such a manner, a metal layer forming process such as electrolytic plating or electroless plating may also be performed to form a porous metal sheet including the first and second metals, if necessary.

For securing the required impact resistance and implementing the electromagnetic wave shielding ability and heat dissipation properties, it is possible to control the pore characteristics of the metal foam. For example, the porosity of the metal foam may be in a range of 50% to 80%. In another example, the porosity of the metal foam may be 52% or more, 54% or more, 56% or more, 58% or more, 60% or more, 62% or more, 64% or more, 66% or more, or 68% or more, or may also be 78% or less, 76% or less, 74% or less, or 72% or less or so. The porosity of such a metal foam can be obtained by a known method of converting the porosity through the volume, mass, density, and the like of the metal foam.

In another example, the porous metal sheet may be a metal fiber sintered sheet or a metal mesh layer.

The metal fiber sintered sheet means a sheet-like article manufactured by applying metal fibers to a papermaking method or the like to have a sheet or film shape, followed by fusion through sintering, and the metal mesh means a sheet-like article manufactured by braiding or weaving metal fibers into a mesh, wire mesh, web or woven fabric shape.

The metal fiber sintered sheet and/or the metal mesh layer as above may also provide a porous metal sheet having the desired electromagnetic wave shielding property, heat dissipation property, and shock absorption property through the application material, thickness and/or pore control, and the like alone.

In order to secure required electromagnetic wave shielding properties, impact resistance and/or heat dissipation properties, it is possible to control the wire diameter, porosity and/or mesh properties of the metal fibers constituting the metal fiber sintered sheet and/or the metal mesh layer.

Here, the wire diameter of the metal fiber means the cross-sectional diameter of the metal fiber, where this wire diameter may be the wire diameter of the metal fiber in a state where the metal fiber sintered sheet or the metal mesh is formed, or may be the wire diameter of the metal fiber used as a raw material before being manufactured into the metal fiber sintered sheet or the metal mesh.

For example, the metal fiber forming the metal fiber sintered sheet or the metal fiber used as a raw material for manufacturing the metal fiber sintered sheet may have a wire diameter in the range of 1 to 80 μm.

Also, in one example, the metal fiber sintered sheet may have porosity in a range of 40 to 80%. The porosity of the sintered metal fiber sheet can be obtained by a known method of converting the porosity through the volume, mass, density, and the like of the sintered metal fiber sheet.

For example, the metal fiber forming the metal mesh layer or the metal fiber used as a raw material for manufacturing the metal mesh layer may have a wire diameter in the range of 25 to 100 μm.

In addition, the metal mesh layer may have a mesh in a range of 100 to 200 mesh.

The metal fiber sintered sheet and/or the metal mesh layer as above may be configured using a known metal material (metal fiber) without any particular limitation. That is, the metal fiber sintered sheet and/or the metal mesh layer may be configured by selecting an appropriate material in consideration of the Young's modulus, specific resistance, thermal conductivity, Poisson ratio and/or density of the aforementioned metal.

The metal fiber sintered sheets and/or the metal mesh layers are variously known, and methods for manufacturing the metal fiber sintered sheet and/or the metal mesh layer are also variously known. In the present disclosure, such a known metal fiber sintered sheet and/or metal mesh layer or a metal fiber sintered sheet and/or metal mesh layer prepared by the known method may be applied.

In order to include the desired first and second metals in the metal fiber sintered sheet and/or the metal mesh layer, a metal layer forming process such as electrolytic plating or electroless plating may also be performed if necessary.

The porous metal sheet of the buffer film may comprise only any one of the metal foam, the metal fiber sintered sheet and the metal mesh layer, or may also be in the form that two or more selected from the foregoing are laminated or combined.

The buffer film or the porous metal sheet included therein may comprise substantially free of organic components such as polymers. This is important in terms of securing desired heat dissipation properties or impact resistance. For example, a composite material or the like, in which a metal foam is complexed with an organic component such as a polymer, is known, but this complexation increases the thermal conductivity of the metal foam in the thickness direction and lowers the impact resistance. Therefore, in the present disclosure, the buffer film or the porous metal sheet included therein needs to comprise substantially free of organic components. Here, the matter of comprising substantially free of organic components means that the ratio of organic components in the buffer film or porous metal sheet is 5 weight % or less, 4.5 weight % or less, 4 weight % or less, 3.5 weight % or less, 3 weight % or less, 2.5 weight % or less, 2 weight % or less, 1.5 weight % or less, 1 weight % or less, or 0.5 weight % or less or so. At this time, the ratio of the organic components excludes organic components included in a layer applied to attach a porous metal sheet to a substrate, such as a sticking layer to be described below. There is no limitation on the lower limit of the ratio of the organic components, and since it is necessary that the organic component is not included, the lower limit of the ratio may be 0 weight %.

The buffer film may comprise a sticking layer for attaching the porous metal sheet to a substrate or the like as an additional constitution. The sticking layer may be formed on one or both sides of the porous metal sheet. As described above, when the porous metal sheet comprises first and second major surfaces having different surface roughness from each other, the sticking layer may be formed on a surface having larger surface roughness among the major surfaces. That is, as described above, if the first major surface and the second major surface of the porous metal sheet have different surface roughness and the first major surface has larger surface roughness than that of the second major surface, the sticking layer may be formed on at least the first major surface.

As the sticking layer, a known pressure-sensitive adhesive layer or adhesive layer may be applied without any particular limitation, and there is no particular limitation on the thickness thereof and the like.

The buffer film may comprise additional other layers if desired. For example, there may be an additional layer, such as a graphite sheet or a graphite layer, for improving the thermal diffusion properties in the plane direction.

However, in terms of constituting a preferably thin device, the buffer film may comprise, as components, only the porous metal sheet and the sticking layer, thereby configuring a thinner device. This is possible because the porous metal sheet included in the buffer film can secure electromagnetic wave shielding properties, heat dissipation properties, and impact resistance required for OLEDs and the like alone.

Therefore, in the present disclosure, it is possible to provide a device such as an OLED in which heat dissipation properties, electromagnetic wave shielding properties and impact resistance (or impact mitigation properties) required in a simple structure are secured without problems such as price increase, process complexity and thickness increase.

The present disclosure also relates to an OLED, specifically an OLED comprising the buffer film.

The OLED of the present disclosure may comprise a substrate; an organic light emitting layer formed on the upper portion of the substrate and a buffer film formed on the lower portion of the substrate. FIG. 2 is a diagram schematically showing an OLED comprising an organic light emitting layer (20), a substrate (10) and a buffer film (100) in sequence. As the buffer film, the above-described buffer film may be applied.

The terms upper portion and lower portion as used above are terms used to define positional relationships of an organic light emitting layer and a buffer film, and the like around a substrate. Therefore, the organic light emitting layer does not necessarily exist above the buffer film in actual transport or use conditions, and the like.

The type of the substrate applied to the OLED is not particularly limited. In general, a glass substrate or a plastic substrate is applied as the substrate when configuring the OLED, and in the present disclosure, the commonly used substrate may be applied without limitation.

In one example, a plastic substrate may be used as the substrate. When the plastic substrate is used, it is advantageous for the configuration of a relatively thin and flexible OLED. However, when the plastic substrate is used, the OLED becomes more vulnerable to external impacts, and it is difficult to effectively cope with electromagnetic waves or heat. However, when the buffer film of the present disclosure is applied, it is possible to take advantage of the plastic substrate while solving such disadvantages.

There is no particular limitation on the type of the organic light emitting layer formed on the substrate. Typically, the organic light emitting layer is present between the opposing positive electrode (anode) and negative electrode (cathode) and includes an organic layer comprising at least a light emitting layer, where such general constitutions may be used without particular limitation herein.

In addition to the light emitting layer, the organic layer may further comprise a necessary known layer such as an electron injection layer, an electron transport layer, a hole transport layer and/or a hole injection layer.

In the organic light emitting layer, any one of the positive negative electrodes may be a transparent electrode, the other may be a reflective electrode, and in some cases, both electrodes may also be a transparent electrode.

Methods and materials for constituting the organic light emitting layer through such a constitution are known, and these known methods and materials may be applied to the present disclosure as well.

In the above structure, the buffer film is a layer which is formed on the lower portion of the substrate, thereby being capable of efficiently removing heat generated from the organic light emitting layer or other components of the OLED, shielding electromagnetic waves generated from the organic light emitting layer or propagating to the organic light emitting layer, and mitigating or eliminating external impacts.

Also, as described above, if the buffer film has a porous metal sheet having different surface roughness on the above-described first and second major surfaces, and having larger surface roughness in the first surface compared to the second surface, the first major surface of the porous metal sheet in the buffer film may be disposed closer to the organic light emitting layer than the second major surface.

In addition, by exhibiting the above-mentioned reflectance, problems such as visibility decrease in the OLED or the like are not caused, and through the securing of the above-described specific resistance, it is possible to form an energization or insulation site, if necessary, in the OLED or the like.

The OLED may further comprise an electronic element formed on the lower portion of the buffer film as an additional constitution. FIG. 3 represents such a constitution, which shows a case in which the organic light emitting layer (20), the substrate (10), the buffer film (100) and the electronic element (40) are sequentially included.

The electronic element is a constitution for applying signals to a driving circuit part driving the organic light emitting layer. Therefore, in this case, the substrate or the organic light emitting layer may comprise a driving circuit part for driving the organic light emitting layer, and the driving circuit part may be connected to the electronic element.

Even in the constitution as in FIG. 3, the buffer film (100) may block heat generated in the organic light emitting layer (20) and/or the electronic element (40) from being transmitted to each other, and shield electromagnetic waves generated in the organic light emitting layer (20) and/or the electronic element (40) from propagating to each other. In addition, even when components such as the substrate (10) are thinned, it is possible to prevent damage to the device due to external impacts.

Specific constitutions of the electronic element and the driving circuit part are not particularly limited, and known constitutions may be applied.

In addition, in the case of such a constitution, only the buffer film may exist between the electronic element and the substrate. Accordingly, a thinner device can be configured. This is possible because the porous metal sheet included in the buffer film alone can secure the electromagnetic wave shielding properties, heat dissipation properties and impact resistance required for OLED.

Advantageous Effects

The present disclosure may provide a buffer film and a use thereof, and in particular, a buffer film for an organic light emitting device and a use thereof.

MODE FOR INVENTION

Hereinafter, the present disclosure will be described in detail through Examples, but the scope of the present disclosure is not limited by the Examples below.
1. Evaluation of Reflectance in Porous Metal Sheet The reflectance of the porous metal sheet (metal foam) included in the buffer film was evaluated for a wavelength of 400 to 800 nm using UV spectroscopy equipment (Shimadzu UV-2600, manufactured by Shimadzu). An integrating sphere (ISR-2600) was mounted on the equipment, and the reflectance was measured in the diffuse reflectance mode according to the manual (diffuse reflectance measurement), where BaSO$_4$ was applied as the standard material. In this way, the reflectance was evaluated at 0.5 nm intervals from 400 nm to 800 nm, and the evaluated reflectance was averaged to identify the reflectance.
2. Evaluation of Thermal Diffusivity The thermal diffusivity of the porous metal sheet (metal foam) included in the buffer film was evaluated by the LFA (Laser Flash Analysis) method, where the evaluated thermal diffusivity is the thermal diffusivity of the xy plane. When measuring the thermal diffusivity, the microflash (LFA 46 Hyper flash, manufactured by Netzsch) equipment was used (in-plane measurement mode). When measuring the thermal diffusivity, a specimen (metal foam) was punched out in a circular shape having a diameter of about 25.4 mm and used.
3. Evaluation of Surface Roughness The surface roughness of the porous metal sheet was measured using a 3D laser microscope (Keyence's VK-X160 model).
4. Evaluation of Specific Resistance The specific resistance of the porous metal sheet (metal foam) included in the buffer film was measured using a four-point probe (FPP) method. At this time, CMT-SR2000N (manufactured by AIT) was used as the equipment.
5. Evaluation of Impact Resistance (Impulse Attenuation)

Figure 4:
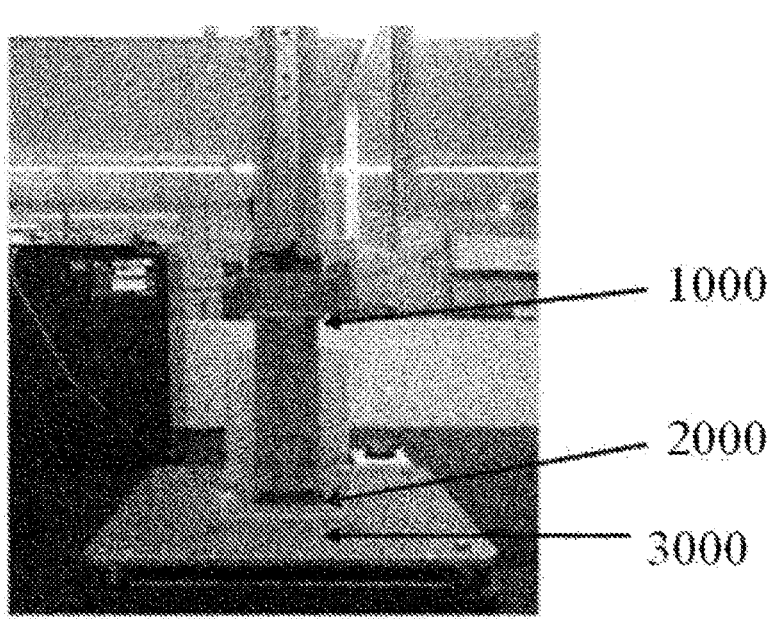
FIG. 4 is a photograph showing a process for evaluating impact resistance.

The impact resistance was evaluated using a ball drop device as shown in FIG. 4. In FIG. 4, the reference numeral 1000 denotes a ball drop position, the reference numeral 2000 denotes a sample position, and the reference numeral 3000 denotes a measurement part. A porous metal sheet (metal foam) was placed at the sample position of FIG. 4, and a ball of the same weight was dropped from the same height to the porous metal sheet with the ball drop device, and the peak impact force was measured by the measurement part. The table below describes the reduction ratios obtained by comparing the results measured in the above manner with the peak impact force measured by dropping the ball in the absence of the porous metal sheet.

Example 1

As a porous metal sheet, a metal foam was prepared. The metal foam was prepared using copper powder having an average particle diameter (median particle diameter, D50 particle diameter) of about 60 μm. Here, copper is a material having a thermal conductivity of about 401 W/mK, a Young's modulus of about 110 to 128 GPa, a Poisson ratio of about 0.34, specific resistance of about 1.7×10$^{-6}$ Ωcm or so, and a density of about 8.96 g/cm$^3$ or so. 30 g of the copper powder, 20 g of terpineol, 8 g of ethylhexyl caprate, 3 g of polyvinyl acetate, and 1 g of a leveling agent (BYK, BYK-358N) were mixed to prepare a slurry. The slurry was coated in the form of a film, dried in an oven at 120° C. for 30 minutes, and then sintered at a temperature of about 1,000° C. or so for about 2 hours under a hydrogen/argon atmosphere to prepare a metal foam. In the above process, the slurry was coated on a smooth surface with little surface roughness, and the side opposite to the side coated on the smooth surface was subjected to sintering in a state exposed to air.

Nickel plating was performed on the copper metal foam thus formed. Here, nickel is a material having a thermal conductivity of about 91 W/mK, a Young's modulus of about 200 GPa, a Poisson ratio of about 0.31, specific resistance of about 6.9×10$^{-6}$ Ωcm or so, and a density of about 8.908 g/cm$^3$ or so.

The electrolytic plating was performed in a known manner. That is, the copper metal foam was put in a solution in which NiSO$_4$, NiCl$_2$ or H$_2$BO$_3$ and the like was dissolved, and the surface of the relevant copper metal foam was plated with nickel by an electrolytic plating method in which a platinum electrode and the copper metal foam were applied as the positive and negative electrodes, respectively. The plating was performed for about 1 minute or so to obtain a nickel-plated copper metal foam. The plating thickness of nickel in the copper metal foam was about 97 nm or so. The plating thickness of the nickel was identified through SEM (scanning electron microscope) observation in a state where a sample (metal foam) was cut with the focused ion beam (FIB) and the cross section was exposed. The prepared metal foam had a thickness of 150 μm or so and a porosity of 74% or so. In addition, the surface roughness (1Sa) of one side (first major surface) of both surfaces of the metal foam was about 8.2 μm or so, and the surface roughness (2Sa) of the other side (second major surface) was about 5.5 μm or so. An acrylic pressure-sensitive adhesive layer was formed on the first major surface to prepare a buffer film.

Example 2

A porous metal sheet was prepared in the same manner as in Example 1, provided that the porous metal sheet was prepared by performing the nickel plating for 2 minutes. The plating thickness of nickel in the copper metal foam was about 142 nm or so. The metal foam thus prepared had a thickness of 151 μm or so and a porosity of 74% or so. In addition, the surface roughness (1Sa) of one side (first major surface) of both surfaces of the metal foam was about 8.2 μm or so, and the surface roughness (2Sa) of the other side (second major surface) was about 5.5 µm or so. An acrylic pressure-sensitive adhesive layer was formed on the first major surface to prepare a buffer film.

Example 3

A porous metal sheet was prepared in the same manner as in Example 1, provided that the porous metal sheet was prepared by performing the nickel plating for 4 minutes. The plating thickness of nickel in the copper metal foam was about 209 nm or so. The metal foam thus prepared had a thickness of 153 µm or so and a porosity of 72% or so. In addition, the surface roughness (1Sa) of one side (first major surface) of both surfaces of the metal foam was about 8.1 µm or so, and the surface roughness (2Sa) of the other side (second major surface) was about 5.5 µm or so. An acrylic pressure-sensitive adhesive layer was formed on the first major surface to prepare a buffer film.

Example 4

A porous metal sheet was prepared in the same manner as in Example 1, provided that the porous metal sheet was prepared by performing the nickel plating for 8 minutes. The plating thickness of nickel in the copper metal foam was about 536 nm or so. The metal foam thus prepared had a thickness of 155 µm or so and a porosity of 70% or so. In addition, the surface roughness (1Sa) of one side (first major surface) of both surfaces of the metal foam was about 8.0 µm or so, and the surface roughness (2Sa) of the other side (second major surface) was about 5.5 µm or so. An acrylic pressure-sensitive adhesive layer was formed on the first major surface to prepare a buffer film.

Example 5

An acrylic pressure-sensitive sticking layer was formed on the second major surface of the porous metal sheet prepared in Example 1 to prepare a buffer film.

Comparative Example 1

The additional nickel plating was not performed on the same copper metal foal as prepared in Example 1, and a pressure-sensitive adhesive layer was formed on the first major surface to prepare a buffer film.

The evaluation results for the respective Examples and Comparative Examples were described in Table 1.

In Table 1 below, the electromagnetic shielding ability is results of measurement in the range of 30 MHz to 1.5 GHz according to ASTM D4935 standard.

From Table 1 above, it can be confirmed that the buffer films according to these examples can satisfy the impact resistance, heat dissipation properties and electromagnetic wave shielding ability required for OLEDs and the like alone.

In addition, it can be confirmed that the porous metal sheet in the buffer films of the above examples shows the low reflectance, so that it is included in the OLED, without causing a visibility problem or the like, and it shows appropriate specific resistance, so that it can form an insulation or energization site necessary for the OLED and the like, whereas it can be confirmed that the buffer film of Comparative Example 1 exhibits excessively high reflectance.

The invention claimed is:

1. A buffer film, comprising:

a porous metal sheet, wherein the porous metal sheet has an average reflectance of 50% or less with respect to light having wavelength ranging from 400 nm to 800 nm, wherein the porous metal sheet has a first major surface and a second major surface having different a surface roughnesses than the first major surface, and wherein a ratio a surface roughness (1Sa) of the first major surface relative to a surface roughness (2Sa) of the second major surface is 1.1 or more to 3 or less.

2. The buffer film according to claim 1, wherein the porous metal sheet has a specific resistance of $1.0 \times 10^{-5}$ Ωcm or more.

3. The buffer film according to claim 1, wherein the porous metal sheet has a thermal diffusivity of 25 mm$^2$/s or more.

4. The buffer film according to claim 1, wherein the surface 1Sa is 6.5 µm or more.

5. The buffer film according to claim 1, wherein the porous metal sheet has a thickness of 50 µm or more.

6. The buffer film according to claim 1, wherein the porous metal sheet comprises a first metal having a Young's modulus of 160 GPa or less and a second metal having a Young's modulus of more than 160 GPa.

7. The buffer film according to claim 1, wherein the porous metal sheet comprises a first metal having specific resistance of $4.3 \times 10^{-6}$ Ωcm or less and a second metal having specific resistance of more than $4.3 \times 10^{-6}$ Ωcm.

8. The buffer film according to claim 1, wherein the porous metal sheet comprises a first metal and a second metal different from the first metal, and wherein the first and second metals each have a Poisson ratio in a range of 0.1 to 0.7.

TABLE 1

| | Example | | | | | Comparative Example |
|---|---|---|---|---|---|---|
| | 1 | 2 | 3 | 4 | 5 | 1 |
| Reflectance (%) | 35 | 29 | 28 | 28 | 35 | 52 |
| Specific resistance (Ωcm) | $1.2 \times 10^{-5}$ | $1.8 \times 10^{-5}$ | $2.0 \times 10^{-5}$ | $2.2 \times 10^{-5}$ | $1.2 \times 10^{-5}$ | $0.8 \times 10^{-5}$ |
| Thermal diffusivity (mm$^2$/s) | 39.3 | 38.2 | 36.8 | 33.8 | 39.3 | 40.3 |
| Impact attenuation amount (%) | 40 | 36.2 | 34.1 | 32.7 | 28 | 35.7 |
| Electromagnetic wave shielding ability (dB) | >80 | >80 | >80 | >80 | >80 | >80 |

9. The buffer film according to claim 1, wherein the porous metal sheet is a metal foam, a metal fiber sintered sheet or a metal mesh.

10. The buffer film according to claim 1, further comprising:

a sticking layer on one or both sides of the porous metal sheet.

11. The buffer film according to claim 10, wherein the sticking layer is formed on the first major surface.

12. An organic light emitting device, comprising:

a substrate;

an organic light emitting layer formed on an upper portion of the substrate; and the buffer film of claim 1 formed on a lower portion of the substrate.

13. The organic light emitting device according to claim 12, wherein the first major surface is disposed closer to the organic light emitting layer than the second major surface.

14. The organic light emitting device according to claim 12, further comprising:

an electronic element formed on the lower portion of the buffer film, wherein only the buffer film is present between the electronic element and the substrate.

\* \* \* \* \*